(12) United States Patent
Lee et al.

(10) Patent No.: US 10,810,938 B2
(45) Date of Patent: Oct. 20, 2020

(54) PIXEL AND ORGANIC LIGHT EMITTING DISPLAY DEVICE

(71) Applicant: Samsung Display Co., Ltd., Yongin-si (KR)

(72) Inventors: Ansu Lee, Seoul (KR); Jun Hyun Park, Suwon-si (KR); Boyong Chung, Suwon-si (KR); Kangmoon Jo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/278,963

(22) Filed: Feb. 19, 2019

(65) Prior Publication Data

US 2019/0259330 A1 Aug. 22, 2019

(30) Foreign Application Priority Data

Feb. 20, 2018 (KR) .......................... 10-2018-0019928

(51) Int. Cl.
*G09G 3/3233* (2016.01)
*G09G 3/3291* (2016.01)
*G09G 3/3258* (2016.01)
*H01L 27/32* (2006.01)

(52) U.S. Cl.
CPC ......... *G09G 3/3233* (2013.01); *G09G 3/3258* (2013.01); *G09G 3/3291* (2013.01); *H01L 27/3262* (2013.01); *H01L 27/3265* (2013.01); *G09G 2300/043* (2013.01); *G09G 2300/0426* (2013.01); *G09G 2300/0819* (2013.01); *G09G 2310/08* (2013.01)

(58) Field of Classification Search
CPC .. G09G 3/3233; G09G 3/3258; G09G 3/3291; G09G 2300/0426; G09G 2300/043; G09G 2300/0819; G09G 2310/08; H01L 27/3262; H01L 27/3265
USPC .......................................................... 345/77
See application file for complete search history.

(56) References Cited

U.S. PATENT DOCUMENTS 9,583,552 B2 2/2017 Oh et al.
2012/0146999 A1* 6/2012 Hwang ................. G09G 3/003
                                                                                                 345/419
2015/0270327 A1* 9/2015 Oh ....................... H01L 51/5209
                                                                                                 257/40

(Continued)

FOREIGN PATENT DOCUMENTS

KR 10-2012-0065139 6/2012
KR 10-2015-0109012 1/2015

*Primary Examiner* — Chanh D Nguyen
*Assistant Examiner* — Ngan T. Pham-Lu
(74) *Attorney, Agent, or Firm* — H.C. Park & Associates

(57) ABSTRACT

An organic light emitting display device which secures a sufficient compensation time during which a threshold voltage of a driving transistor is compensated by driving a display panel using a simultaneous emission driving method by which a plurality of pixels simultaneously emit light. The organic light emitting display device may reduce a length (or, a time) of a non-emission period by storing a data signal of a current frame into a second capacitor of the pixel in an emission period of a previous frame and by adjusting a voltage at a gate electrode of a driving transistor of the pixel based on a voltage stored in the second capacitor in a data writing period of the current frame.

20 Claims, 9 Drawing Sheets

(56) References Cited

U.S. PATENT DOCUMENTS

2017/0148383 A1  5/2017  Kim
2017/0200781 A1  7/2017  Jin

* cited by examiner

PIXEL AND ORGANIC LIGHT EMITTING DISPLAY DEVICE

CROSS REFERENCE TO RELATED APPLICATION(S)

This application claims priority from and the benefit of Korean Patent Application No. 10-2018-0019928, filed on Feb. 20, 2018, which is hereby incorporated by reference for all purposes as if fully set forth herein.

BACKGROUND

Field

Exemplary embodiments of the invention relate generally to a display device and, more specifically, to a pixel and an organic light emitting display device including the pixel.

Discussion of the Background

Each pixel of an organic light emitting display device includes a light emitting element (e.g., an organic light emitting diode), of which luminance is changed by a driving current. The pixel includes the light emitting element, a driving transistor which controls an amount of the driving current flowing through the light emitting element based on a data voltage, and a switching transistor which provides the data voltage to the driving transistor to control the luminance of the light emitting element.

The driving transistors included in the pixels of the organic light emitting display device may have different threshold voltages due to a manufacturing process error. Thus, an amount of the driving current output from respective driving transistors may differ according to respective threshold voltages even when the same data voltage is applied. As a result, a luminance deviation may occur in the organic light emitting display device. To solve this problem, various pixel circuits have been developed which are capable of compensating the threshold voltage of the driving transistor included in the pixel.

In addition, in order to secure a sufficient threshold voltage compensation time, an organic light emitting display device has been developed which drives a display panel using a simultaneous emission driving method by which a plurality of pixels simultaneously emit light. However, a conventional organic light emitting display device employing the simultaneous emission driving method has relatively low luminous efficiency because a ratio of a non-emission period is relatively high in one frame. In addition, durability of the conventional organic light emitting display device is relatively low.

The above information disclosed in this Background section is only for understanding of the background of the inventive concepts, and, therefore, it may contain information that does not constitute prior art.

SUMMARY

Exemplary embodiments provide an organic light emitting display device having high luminous efficiency.

Exemplary embodiments also provide a pixel included in the organic light emitting display device.

Additional features of the inventive concepts will be set forth in the description which follows, and in part will be apparent from the description, or may be learned by practice of the inventive concepts.

An exemplary embodiment provides an organic light emitting display device including a display panel including a plurality of pixels and a panel driver configured to provide a first gate signal, a second gate signal, a third gate signal, and a data signal to the pixels. Each of the pixels includes: a first transistor including a gate electrode which is connected to a first node, a first electrode which receives a first power voltage, and a second electrode which is connected to a second node; a second transistor including a gate electrode which receives the third gate signal, a first electrode which is connected to the first node, and a second electrode which is connected to the second node; a third transistor including a gate electrode which receives the second gate signal, a first electrode which is connected to a third node, and a second electrode which is connected to the first node; a fourth transistor including a gate electrode which receives the first gate signal, a first electrode which receives the data signal, and a second electrode which is connected to the third node; a first capacitor including a first electrode which receives a first voltage and a second electrode which is connected to the first node; a second capacitor including a first electrode which receives a second voltage and a second electrode which is connected to the third node; and a light emitting element including a first electrode which is connected to the second node and a second electrode which receives a second power voltage.

The data signal may be applied to the second electrode of the second capacitor in at least a portion of an emission period in which the light emitting element emits light.

The panel driver may drive the display panel by dividing one frame into: a first period in which the first transistor is initialized; a second period in which a threshold voltage of the first transistor is compensated; a third period in which a voltage at the gate electrode of the first transistor is adjusted based on the data signal; and a fourth period in which the light emitting element emits light.

In the first period, the third gate signal may be activated, and the second gate signal and the first gate signal may be deactivated.

In the first period, the first power voltage may be lower than the second power voltage.

In the second period, the third gate signal may be activated, and the second gate signal and the first gate signal may be deactivated.

In the third period, the second gate signal may be activated, and the third gate signal and the first gate signal may be deactivated.

In the third period, the first power voltage may be lower than the second power voltage.

The pixels may be arranged in a plurality of pixel rows in the display panel. In addition, in the fourth period, the panel driver may sequentially provide the first gate signal which is activated to the pixel rows.

In the fourth period, the second gate signal and the third gate signal may be deactivated.

The pixels may be arranged in a plurality of pixel rows in the display panel. In addition, the panel driver may concurrently provide the second gate signal and the third gate signal to all of the pixel rows. Further, the panel driver may sequentially provide the first gate signal which is activated to the pixel rows in at least a portion of an emission period in which the light emitting element emits light.

The panel driver may provide the data signal corresponding to a second frame to the pixels in at least the portion of the emission period of a first frame, where the second frame follows the first frame.

The first transistor may be a p-channel metal oxide semiconductor (PMOS) transistor. In addition, the second transistor, the third transistor, and the fourth transistor may be n-channel metal oxide semiconductor (NMOS) transistors.

Another exemplary embodiment provides a pixel including: a first transistor including a gate electrode which is connected to a first node, a first electrode which receives a first power voltage, and a second electrode which is connected to a second node; a second transistor including a gate electrode which receives a third gate signal, a first electrode which is connected to the first node, and a second electrode which is connected to the second node; a third transistor including a gate electrode which receives a second gate signal, a first electrode which is connected to a third node, and a second electrode which is connected to the first node; a fourth transistor including a gate electrode which receives a first gate signal, a first electrode which receives a data signal, and a second electrode which is connected to the third node; a first capacitor including a first electrode which receives a first voltage and a second electrode which is connected to the first node; a second capacitor including a first electrode which receives a second voltage and a second electrode which is connected to the third node; and a light emitting element including a first electrode which is connected to the second node and a second electrode which receives a second power voltage.

The data signal may be applied to the second electrode of the second capacitor in at least a portion of an emission period in which the light emitting element emits light.

In a first period in which the first transistor is initialized, the third gate signal may be activated, the second gate signal and the first gate signal may be deactivated, and the first power voltage may be lower than the second power voltage.

In a second period in which a threshold voltage of the first transistor is compensated, the third gate signal may be activated, and the second gate signal and the first gate signal may be deactivated.

In a third period in which a voltage at the gate electrode of the first transistor is adjusted based on the data signal, the second gate signal may be activated, the third gate signal and the first gate signal may be deactivated, and the first power voltage may be lower than the second power voltage.

In at least a portion of a fourth period in which the light emitting element emits light, the first gate signal may be activated.

The first transistor may be a p-channel metal oxide semiconductor (PMOS) transistor, and the second transistor, the third transistor, and the fourth transistor may be n-channel metal oxide semiconductor (NMOS) transistors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
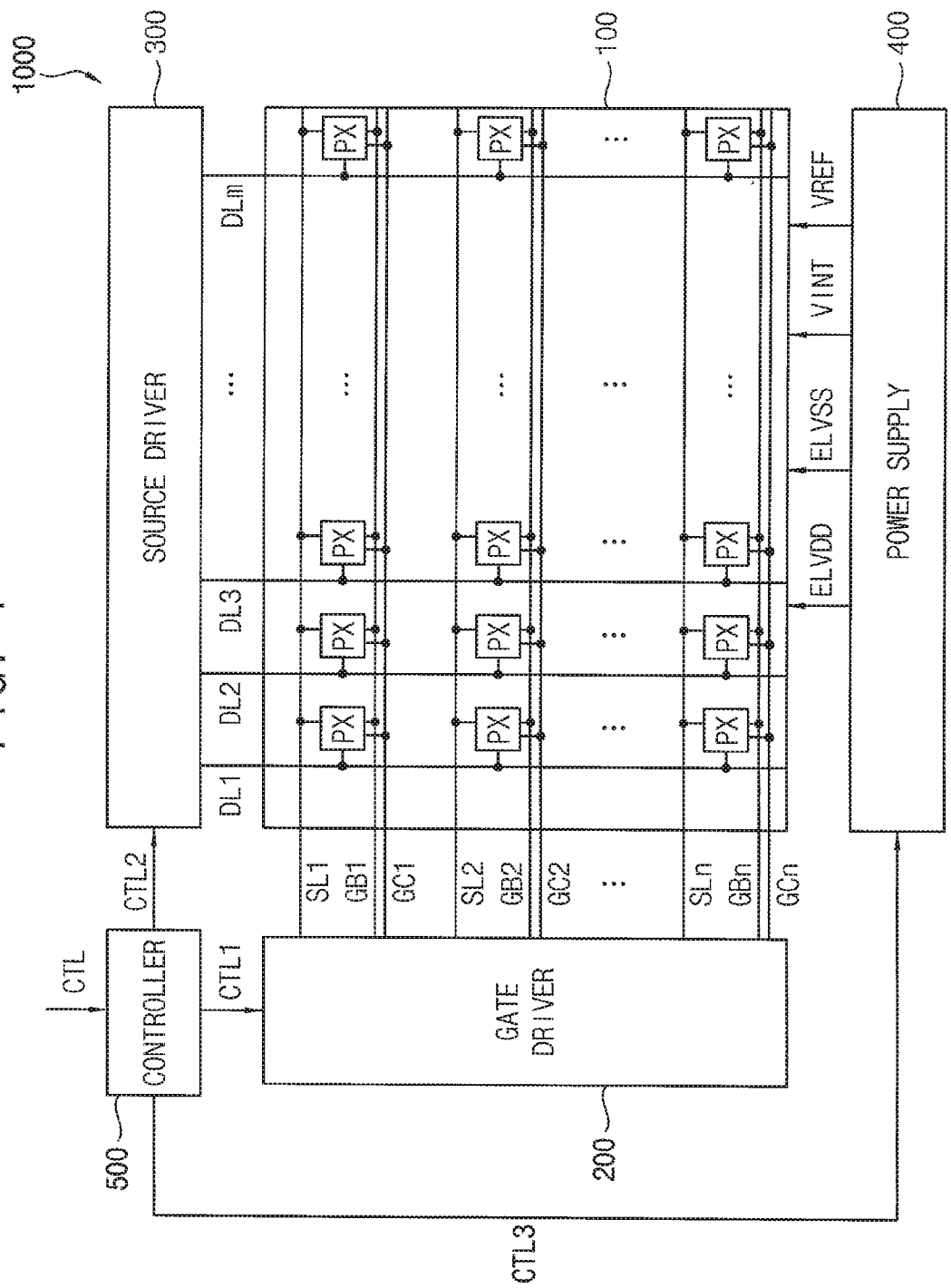
FIG. 1 is a block diagram illustrating an organic light emitting display device according to exemplary embodiments.

In the following description, for the purposes of explanation, numerous specific details are set forth in order to provide a thorough understanding of various exemplary embodiments of the invention. As used herein "embodiments" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present inventive concepts will be explained in detail with reference to the accompanying drawings.

FIG. 1 is a block diagram illustrating an organic light emitting display device according to exemplary embodiments.

Referring to FIG. 1, the organic light emitting display device 1000 may include a display panel 100 including a plurality of pixels PX and a panel driver which drives the display panel 100. In an exemplary embodiment, the panel driver may include a gate driver 200, a source driver 300, a power supply 400, and a controller 500 (e.g., a timing controller).

The pixels PX may be used to display an image. For example, the display panel 100 may include n×m pixels PX that are arranged at locations corresponding to intersections between first gate lines SL1 through SLn and data lines DL1 through DLm, where n and m are integers greater than or equal to 1. In other words, the pixels PX may be arranged in n pixel rows and m pixel columns.

The pixels PX may be driven by a simultaneous emission driving method. A data signal of a current frame may be applied to a second capacitor of the pixel PX in an emission period of a previous frame. The data signal stored in the second capacitor may be applied to a gate electrode of a driving transistor in a charge-sharing manner in a data writing period of the current frame. Thus, a length (or, a time) of a non-emission period may be reduced. A structure of the pixel PX will be described in detail with reference to FIGS. 2, 9, and 10.

Based on a first control signal CTL1, the gate driver 200 may provide: a first gate signal to the pixels PX via the first gate lines SL1 through SLn; a second gate signal to the pixels PX via second gate lines GB1 through GBn; and a third gate signal to the pixels PX via third gate lines GC1 through GCn. The gate driver 200 may concurrently provide the second gate signal and the third gate signal to all of the pixel rows. On the other hand, the gate driver 200 may sequentially provide the first gate signal which is activated to the pixel rows in a portion of the emission period in which the pixel PX emits light.

Based on a second control signal CTL2, the source driver 300 may convert a digital image data into an analog data voltage (i.e., a data signal) and may provide the data signal to the pixels PX via the data lines DL1 through DLm. In an exemplary embodiment, the source driver 300 may provide the data signal corresponding to the activated first gate signal S1 through Sn to the pixels PX in at least the portion of the emission period in which the pixel PX emits light.

Based on a third control signal CTL3, the power supply 400 may provide a first power voltage ELVDD, a second power voltage ELVSS, a first voltage VINT, and a second voltage VREF to the pixels PX. For example, the power supply 400 may include a DC-DC converter that generates output voltages having various voltage levels from an input voltage (e.g., a battery voltage).

The controller 500 may control the gate driver 200, the source driver 300, and the power supply 400. For example, the controller 500 may receive a control signal CTL from an external component (e.g., a system board). The controller 500 may generate the first control signal CTL1, the second control signal CTL2, and the third control signal CTL3 to control the gate driver 200, the source driver 300, and the power supply 400, respectively. The first control signal CTL1 for controlling the gate driver 200 may include a vertical start signal, a clock signal, etc. The second control signal CTL2 for controlling the source driver 300 may include a horizontal start signal, a load signal, image data, etc. The third control signal CTL3 for controlling the power supply 400 may include a control signal for controlling a voltage level. The controller 500 may generate the digital image data suitable for an operating condition of the display panel 100 based on input image data and may provide the digital image data to the source driver 300.

Figure 2:
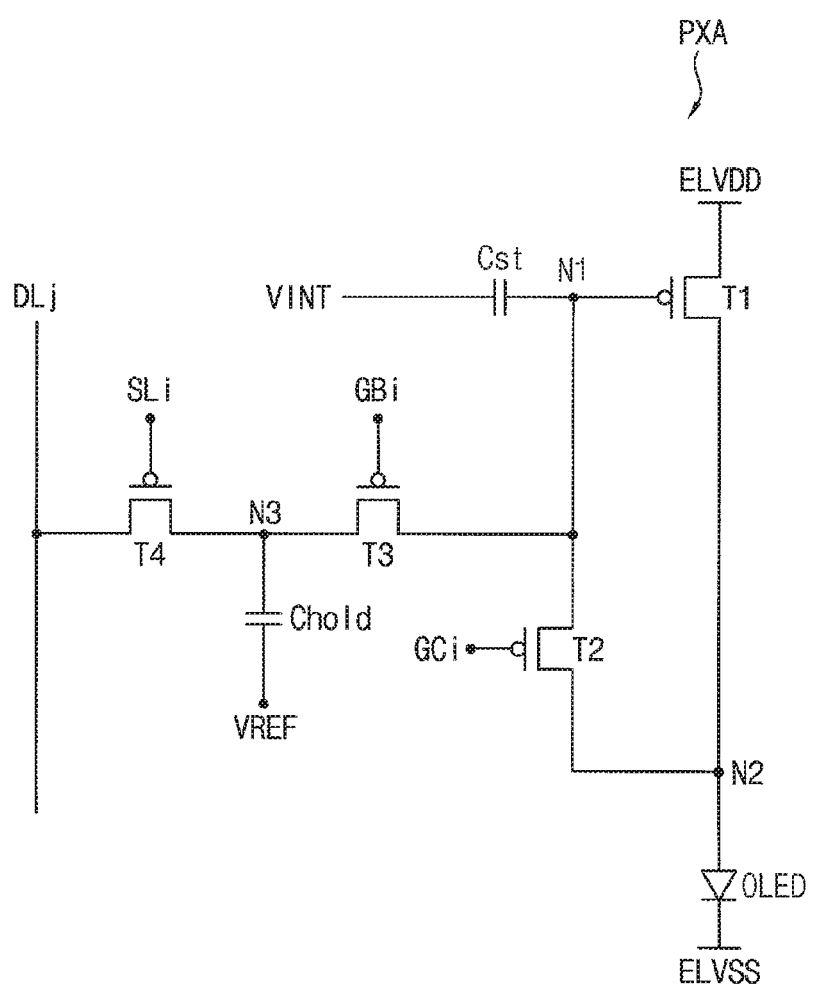
FIG. 2 is a schematic diagram illustrating an example of a pixel included in the organic light emitting display device of FIG. 1.

FIG. 2 is a schematic diagram illustrating an example of a pixel included in the organic light emitting display device of FIG. 1.

Referring to FIG. 2, the pixel PXA may include first through fourth transistors T1 through T4, first and second capacitors Cst and Chold, and a light emitting element OLED. The pixel PXA may be arranged in an (i)-th pixel-row and a (j)-th pixel column, where i is an integer between 1 and n and j is an integer between 1 and m. The pixel PXA may be implemented by p-channel metal oxide semiconductor (PMOS) transistors.

The first transistor T1 may be a driving transistor. The first transistor T1 may control an amount of a driving current flowing through the light emitting element OLED based on a data signal. In an exemplary embodiment, the first transistor T1 may include a gate electrode which is connected to a first node N1, a first electrode which receives a first power voltage ELVDD, and a second electrode which is connected to a second node N2.

The second transistor T2 may connect the first node N1 and the second node N2 in response to a third gate signal received from a third gate line GCi. In an exemplary embodiment, the second transistor T2 may include a gate electrode which receives the third gate signal, a first electrode which is connected to the first node N1, and a second electrode which is connected to the second node N2.

The third transistor T3 may connect a third node N3 and the first node N1 in response to a second gate signal received from a second gate line GBi. In an exemplary embodiment, the third transistor T3 may include a gate electrode which receives the second gate signal, a first electrode which is connected to the third node N3, and a second electrode which is connected to the first node N1.

The fourth transistor T4 may connect a data line DLj and the third node N3 in response to a first gate signal received from a first gate line SLi. In an exemplary embodiment, the fourth transistor T4 may include a gate electrode, which receives the first gate signal, a first electrode which receives the data signal, and a second electrode which is connected to the third node N3.

The first capacitor Cst may be connected between a first voltage VINT and the first node N1. In an exemplary embodiment, the first capacitor Cst may include a first electrode, which receives the first voltage VINT, and a second electrode, which is connected to the first node N1.

The second capacitor Chold may be connected between a second voltage VREF and the third node N3. In an exemplary embodiment, the second capacitor Chold may include a first electrode which receives the second voltage VREF and a second electrode which is connected to the third node N3.

The light emitting element OLED may emit light with luminance corresponding to the driving current which flows from the first transistor T1 (i.e., the driving transistor) to the light emitting element OLED. In an exemplary embodiment, the light emitting element OLED may include a first electrode (e.g., an anode), which is connected to the second node N2, and a second electrode (e.g., a cathode), which receives a second power voltage ELVSS. For example, the light emitting element OLED may be an organic light emitting diode.

Figure 3:
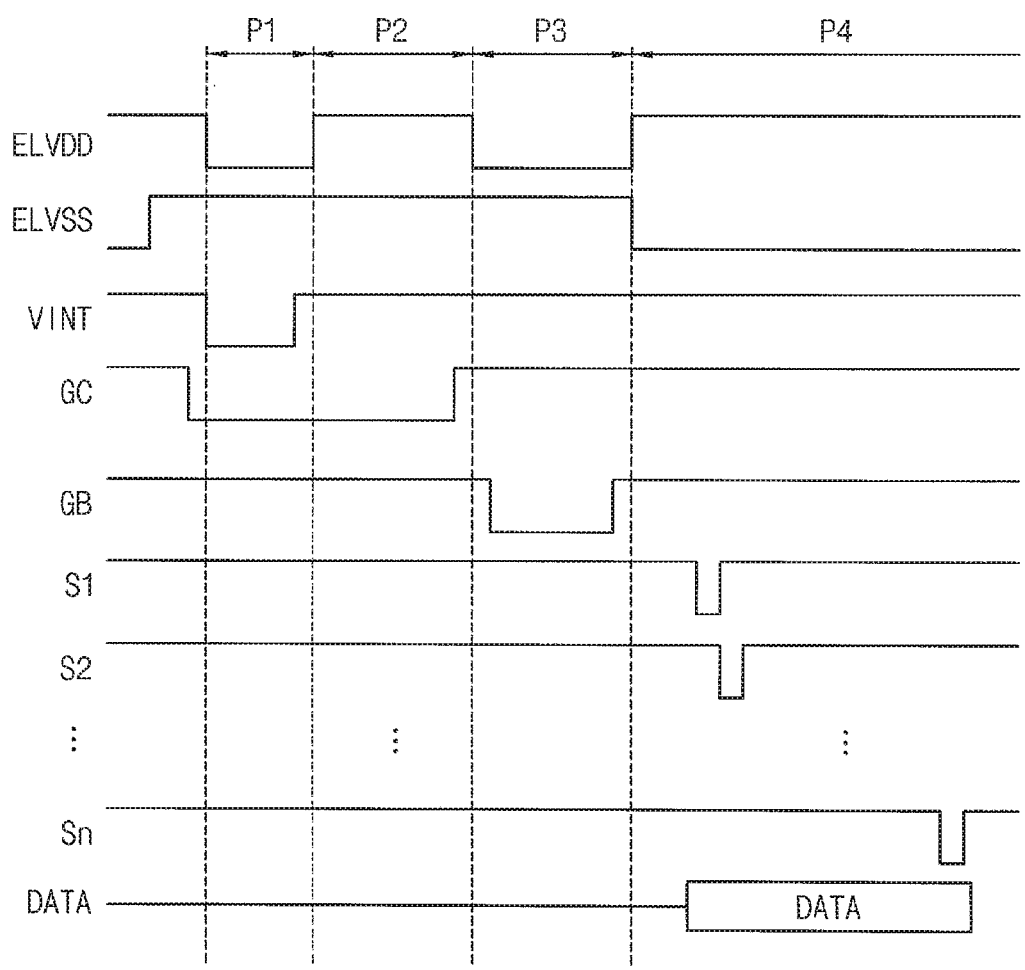
FIG. 3 is a timing diagram illustrating an example in which the pixel of FIG. 2 operates.
Figure 4:
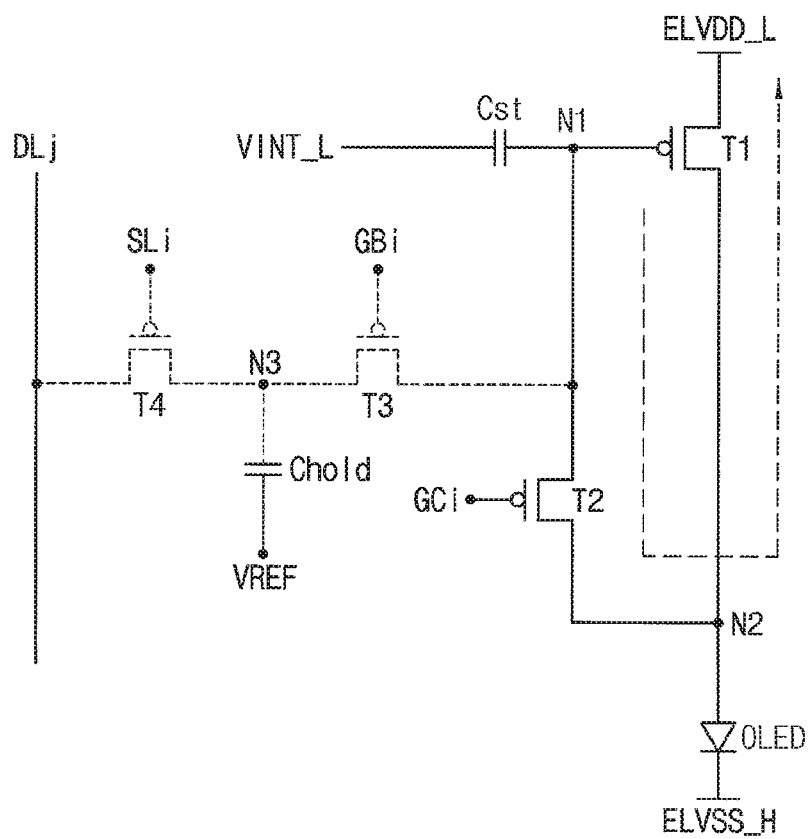
FIG. 4 is a diagram illustrating an example in which the pixel of FIG. 2 operates in a first period.
Figure 5:
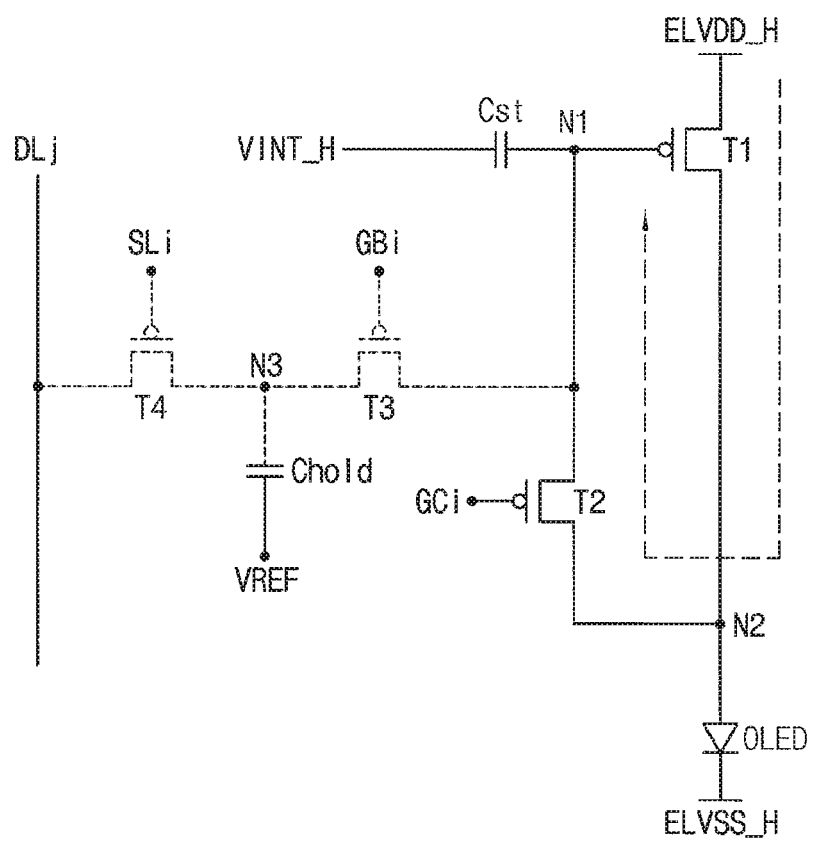
FIG. 5 is a diagram illustrating an example in which the pixel of FIG. 2 operates in a second period.
Figure 6:
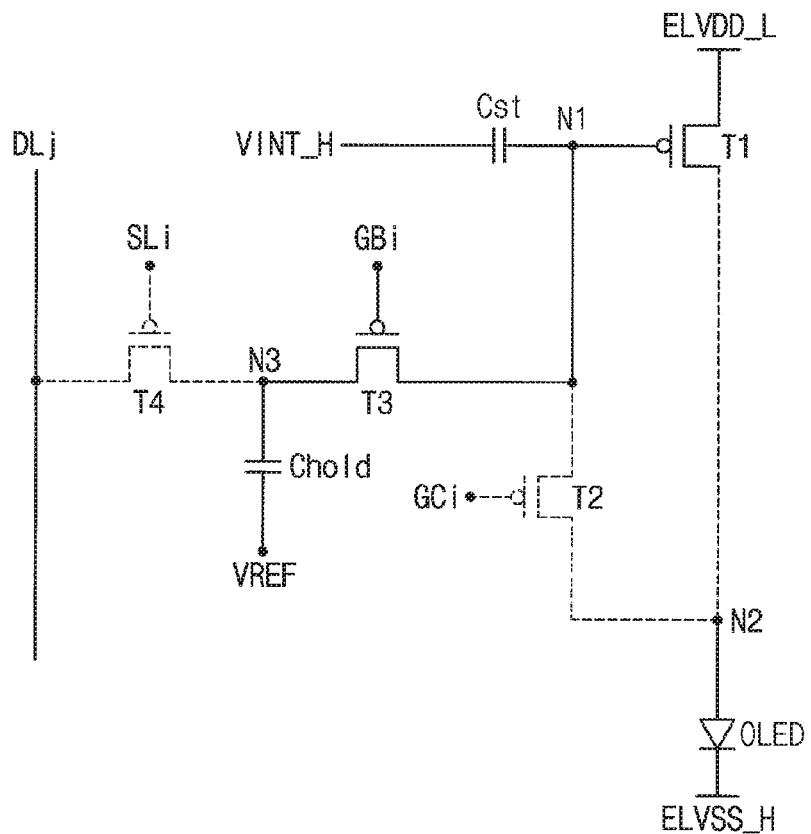
FIG. 6 is a diagram illustrating an example in which the pixel of FIG. 2 operates in a third period.
Figure 7:
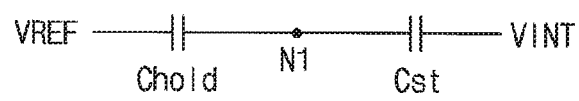
FIG. 7 is a diagram illustrating an example in which a voltage at a gate electrode of a driving transistor included in the pixel of FIG. 2 is adjusted to be a voltage corresponding to a data voltage.
Figure 8:
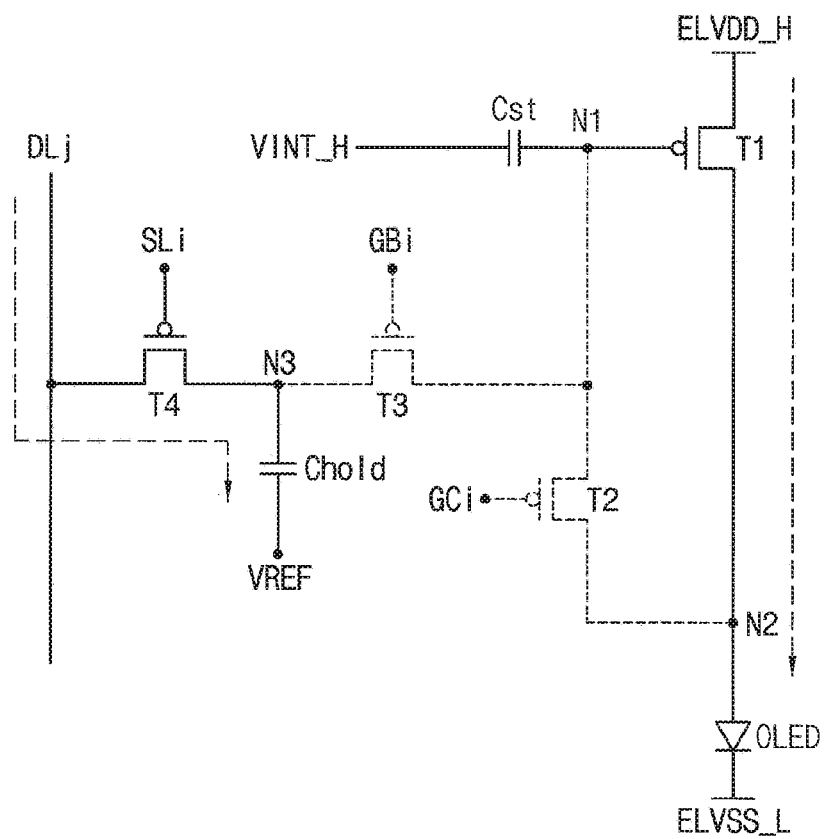
FIG. 8 is a diagram illustrating an example in which the pixel of FIG. 2 operates in a fourth period.

FIG. 3 is a timing diagram illustrating an example in which the pixel of FIG. 2 operates. FIG. 4 is a diagram illustrating an example in which the pixel of FIG. 2 operates in a first period. FIG. 5 is a diagram illustrating an example in which the pixel of FIG. 2 operates in a second period. FIG. 6 is a diagram illustrating an example in which the pixel of FIG. 2 operates in a third period. FIG. 7 is a diagram illustrating an example in which a voltage at a gate electrode of a driving transistor included in the pixel of FIG. 2 is adjusted to be a voltage corresponding to a data voltage. FIG. 8 is a diagram illustrating an example in which the pixel of FIG. 2 operates in a fourth period.

Referring to FIGS. 3 to 8, the panel driver may drive a display panel using a simultaneous emission driving method. According to the simultaneous emission driving method, one frame may include a non-emission period P1, P2, and P3 in which the pixels do not emit light, and an emission period P in which the pixels simultaneously emit light. The panel driver may concurrently provide a second gate signal GB and a third gate signal GC to all of the pixel rows. On the other hand, the panel driver may sequentially provide a first gate signal S1 through Sn which is activated to the pixel rows in a portion of the emission period P in which a light emitting element of the pixel emit light.

As illustrated in FIG. 3, the panel driver may drive the display panel by dividing one frame into the first period P1 in which a first transistor T1 is initialized; the second period P2 in which a threshold voltage of the first transistor T1 is compensated; the third period P3 in which a voltage at a gate electrode of the first transistor T1 is adjusted based on a data signal DATA; and the fourth period P in which the light emitting element emits light.

In the first period P1, the third gate signal GC may be activated (e.g., may switch to a low voltage level), and the second gate signal GB and the first gate signal S1 through Sn may be deactivated (e.g., may switch to a high voltage level). In addition, in the first period P1, a first power voltage ELVDD may be lower than a second power voltage ELVSS. That is, the first power voltage ELVDD may have a low voltage level ELVDD_L, and the second power voltage ELVSS may have a high voltage level ELVSS_H. A first voltage VINT may have a low voltage level VINT_L. As illustrated in FIG. 4, in the first period P1, a second transistor T2 may be turned on, and a third transistor T3 and a fourth transistor T4 may be turned off. Because the first power voltage ELVDD has the low voltage level ELVDD_L, a current may flow from a first node N1 to the first power voltage ELVDD via the second transistor T2 and the first transistor T1. Thus, a voltage at the first node N1 and a voltage at a second node N2 may be initialized to be a voltage corresponding to the low voltage level ELVDD_L of the first power voltage ELVDD.

In the second period P2, the third gate signal GC may be activated, and the second gate signal GB and the first gate signal S1 through Sn may be deactivated. Thus, as illustrated in FIG. 5, in the second period P2, the second transistor T2 may be turned on, and the third transistor T3 and the fourth transistor T4 may be turned off. Because the first transistor T1 is diode-connected in the second period P2, the voltage at the gate electrode of the first transistor T1 may be set to be a voltage which reflects the threshold voltage Vth of the first transistor T1. Specifically, since the first power voltage ELVDD has the high voltage level ELVDD_H, a current may flow from the first power voltage ELVDD to the first node N1 via the first transistor T1 and the second transistor T2. Thus, the voltage at the first node N1 and the voltage at the second node N2 may be set to be a voltage ELVDD_H+Vth obtained by adding the threshold voltage Vth of the first transistor T1 to the high voltage level ELVDD_H of the first power voltage ELVDD.

In the third period P3, the second gate signal GB may be activated, and the third gate signal GC and the first gate signal S1 through Sn may be deactivated. In the third period P3, the first power voltage ELVDD may be lower than the second power voltage ELVSS in order that a current does not flow through the light emitting element OLED. That is, the first power voltage ELVDD may have the low voltage level ELVDD_L, and the second power voltage ELVSS may have the high voltage level ELVSS_H. As illustrated in FIG. 6, in the third period P3, the third transistor T3 may be turned on, and the second transistor T2 and the fourth transistor T4 may be turned off. As illustrated in FIG. 7, the data signal may be applied to the pixel in a charge-sharing manner. In other words, when the third transistor T3 is turned on, first and second capacitors Cst and Chold, which are connected in series, may perform a charge-sharing operation. The voltage at the gate electrode of the first transistor T1 (i.e., the voltage at the first node N1) may be changed in accordance with the data signal based on capacitances of the first and second capacitors Cst and Chold. For example, the voltage at the first node N1 may be calculated using [Equation 1] below:

$$VN1 = ELVDDH + Vth + \frac{C2}{C1+C2}(VREF - Vdata),$$ [Equation 1]

where VN1 denotes the voltage at the first node N1, ELVDDH denotes the high voltage level of the first power voltage ELVDD, Vth denotes the threshold voltage of the first transistor T1, C1 denotes the capacitance of the first capacitor Cst, C2 denotes the capacitance of the second capacitor Chold, VREF denotes the second voltage, and Vdata denotes the data voltage.

In the fourth period P4, the second gate signal GB and the third gate signal GC may be deactivated. In the fourth period P4, the first power voltage ELVDD may be higher than the second power voltage ELVSS in order that a driving current corresponding to the data signal flows through the light emitting element OLED. That is, the first power voltage ELVDD may have a high voltage level ELVDD_H, and the second power voltage ELVSS may have a low voltage level ELVSS_L. For example, the driving current flowing through the light emitting element OLED may be calculated using [Equation 2] below:

$$|d| = \left(\frac{k}{2}\right)\left[\frac{C2}{C1+C2}(VREF - Vdata)\right]^2,$$ [Equation 2]

where k denotes a constant according to characteristics of the first transistor T1, C1 denotes the capacitance of the first capacitor Cst, C2 denotes the capacitance of the second capacitor Chold, VREF denotes the second voltage, and Vdata denotes the data voltage.

As shown above, an amount of the driving current may not be affected by the threshold voltage Vth of the driving transistor (i.e., the first transistor T1), and thus, the display quality may be improved.

In addition, in the fourth period P4, the first gate signal S1 through Sn, which are activated, may be sequentially provided to the pixel rows. For example, in the fourth period P4, the first gate signal S1 through Sn, which are activated, may be sequentially provided to first through (n)-th pixel rows, respectively. In the fourth period P4, the second gate signal GB may be deactivated, and the third transistor T3 may be turned off. Thus, in the fourth period P4, a data voltage of a next frame may be applied to the second capacitors Chold of the pixels, regardless of an emission operation of the pixels while the pixels emit light.

Thus, a data signal corresponding to a second frame, which follows a first frame, may be provided to the pixels in at least a portion of the emission period of the first frame, and the data signal stored in the second capacitor Chold may be provided to the gate electrode of the driving transistor in a charge-sharing manner in a data writing period of the second frame. Thus, the organic light emitting display device may reduce a length (or, a time) of the third period P3 of the non-emission period. For example, in a conventional display device in which the data signal is sequentially written into the pixels in the data writing period, a ratio of an emission period in one frame may be less than 50%. On the other hand, the organic light emitting display device 1000 may increase a ratio of the emission period P4 in one frame up to more than 90% while driving the display panel 100 using the simultaneous emission driving method.

Figure 9:
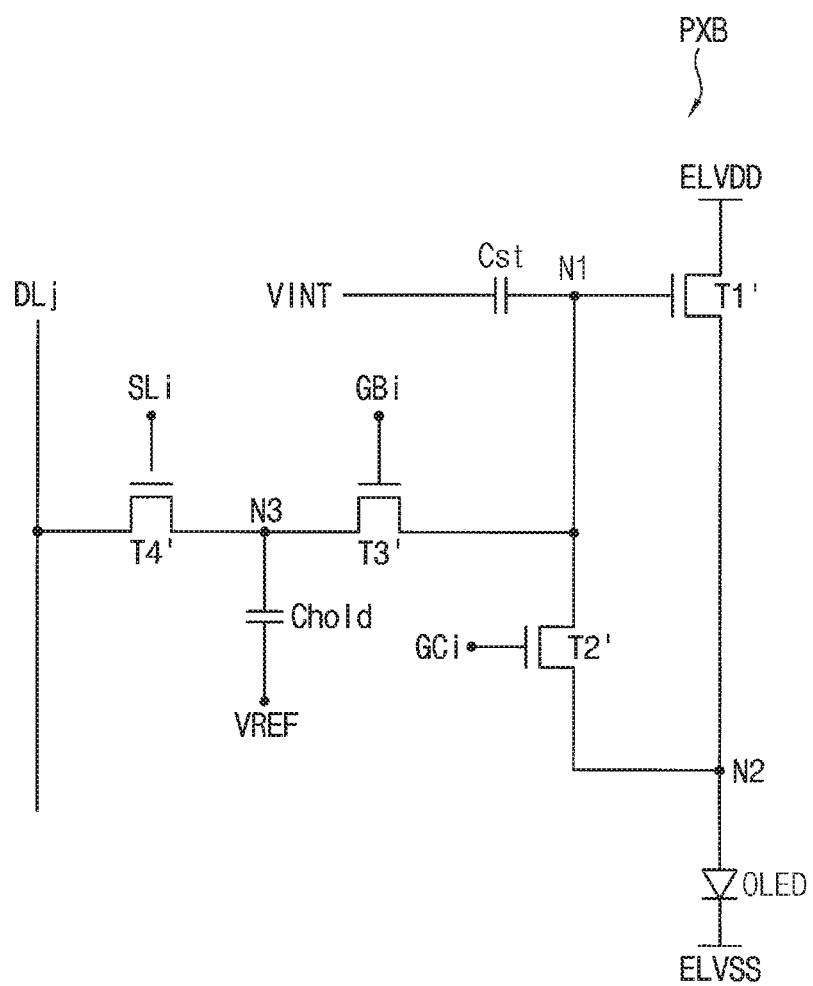
FIG. 9 is a circuit diagram illustrating another example of a pixel included in the organic light emitting display device of FIG. 1.

FIG. 9 is a circuit diagram illustrating another example of a pixel included in the organic light emitting display device of FIG. 1.

Referring to FIG. 9, the pixel PXB may include: first through fourth transistors T1' through T4'; first and second capacitors Cst and Chold; and a light emitting element OLED. The pixel PXB may be arranged in an (i)-th pixel-row and a (j)-th pixel column, where i is an integer between 1 and n, and j is an integer between 1 and m. The pixel PXB may be substantially the same as the pixel PXA of FIG. 2, except that the first through fourth transistors T1' through T4' are implemented by NMOS transistors. Thus, the same reference numerals will be used for the same or similar components, and duplicate descriptions will not be repeated.

The first transistor T1' may be a driving transistor. The first transistor T1' may control an amount of a driving current flowing through the light emitting element OLED based on a data signal. In an exemplary embodiment, the first transistor T1' may be the NMOS transistor. In this case, an afterimage due to hysteresis may be reduced because the NMOS transistor is less affected by the hysteresis as compared to a PMOS transistor.

The second transistor T2' may connect a first node N1 and a second node N2 in response to a third gate signal received from a third gate line GCi. The third transistor T3' may connect a third node N3 and the first node N1 in response to a second gate signal received from a second gate line GBi. The fourth transistor T4' may connect a data line DLj and the third node N3 in response to a first gate signal received from a first gate line SLi. In an exemplary embodiment, the second through fourth transistors T2' through T4' may be the NMOS transistors. In this case, degradation of a displaying-quality due to a leakage current occurring in a switching transistor may be prevented.

The first capacitor Cst may be connected between a first voltage VINT and the first node N1. The second capacitor Chold may be connected between a second voltage VREF and the third node N3.

The light emitting element OLED may emit light with luminance corresponding to the driving current which flows from the first transistor T1 (i.e., the driving transistor) to the light emitting element OLED.

Since a driving manner of the pixel PXB of FIG. 9 is substantially the same as that of the pixel PXA of FIG. 2, duplicate descriptions will not be repeated.

Figure 10:
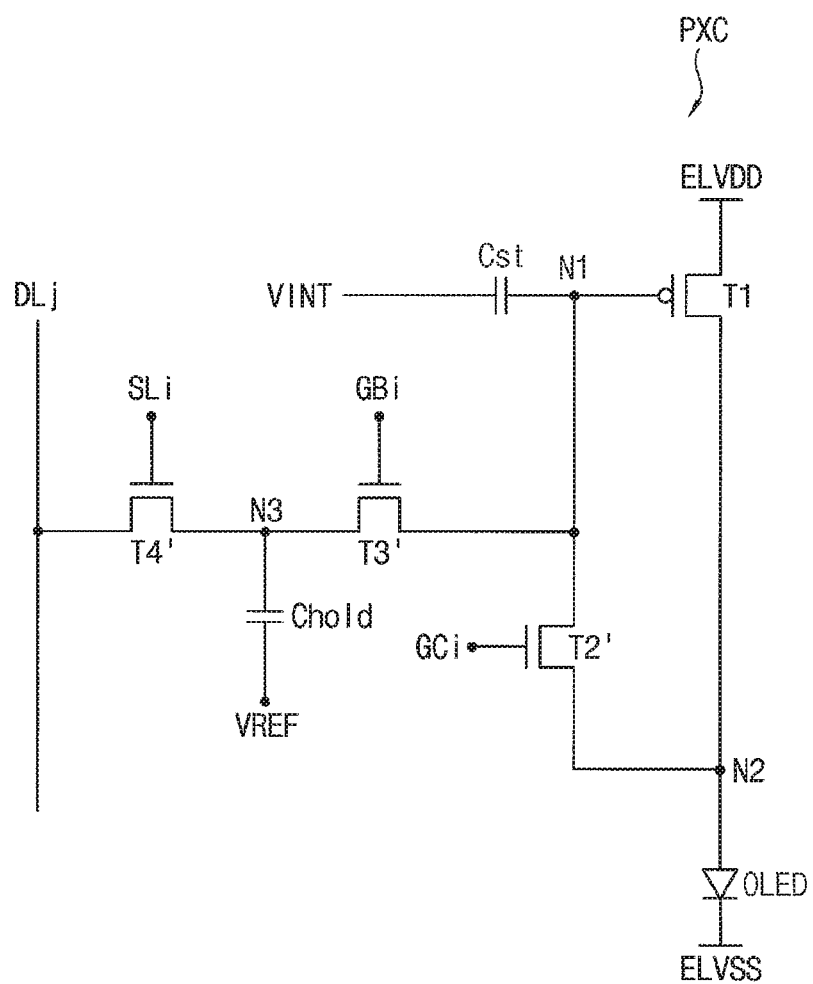
FIG. 10 is a circuit diagram illustrating still another example of a pixel included in the organic light emitting display device of FIG. 1.

FIG. 10 is a circuit diagram illustrating still another example of a pixel included in the organic light emitting display device of FIG. 1.

Referring to FIG. 10, the pixel PXC may include first through fourth transistors T1, T2' through T4', first and second capacitors Cst and Chold, and a light emitting element OLED. The pixel PXC may be arranged in an (i)-th pixel-row and a (j)-th pixel column, where i is an integer between 1 and n and j is an integer between 1 and m. The pixel PXC may be substantially the same as the pixel PXA of FIG. 2, except that the first transistor T1 is implemented by a PMOS transistor, and second through fourth transistors T2' through T4' are implemented by NMOS transistors. Thus, the same reference numerals will be used for the same or similar components, and duplicate descriptions will not be repeated.

The first transistor T1 may be a driving transistor. The first transistor T1 may control an amount of a driving current flowing through the light emitting element OLED based on a data signal. In an exemplary embodiment, the first transistor T1 may be a PMOS transistor. Because the PMOS transistor is more reliable than the NMOS transistor, reliability of the organic light emitting display device 1000 may be improved when the driving transistor is implemented by the PMOS transistor.

The second transistor T2' may connect a first node N1 and a second node N2 in response to a third gate signal received from a third gate line GCi. The third transistor T3' may connect a third node N3 and the first node N1 in response to a second gate signal received from a second gate line GBi. The fourth transistor T4' may connect a data line DLj and the third node N3 in response to a first gate signal received from a first gate line SLi. In an exemplary embodiment, the second through fourth transistors T2' through T4' may be the NMOS transistors. In this case, degradation of a displaying-quality due to a leakage current occurring in a switching transistor may be prevented.

The first capacitor Cst may be connected between a first voltage VINT and the first node N1. The second capacitor Chold may be connected between a second voltage VREF and the third node N3.

The light emitting element OLED may emit light with luminance corresponding to the driving current which flows from the first transistor T1 (i.e., the driving transistor) to the light emitting element OLED.

In brief, the driving transistor may be implemented by the PMOS transistor to improve reliability of the pixel PXC, and the switching transistor may be implemented by the NMOS transistor to prevent the leakage current.

Although it is illustrated in FIG. 10 that the second through fourth transistors T2' through T4' are the NMOS transistors, the inventive concepts are not limited thereto. For example, the second and third transistors T2' and T3' may be implemented by the NMOS transistors to prevent the leakage current, and the fourth transistor T4 may be implemented by the PMOS transistor to improve the reliability.

Although a pixel and an organic light emitting display device including the pixel according to exemplary embodiments have been described with reference to figures, those skilled in the art will readily appreciate that many modifications are possible in the exemplary embodiments without materially departing from the novel teachings and advantages of the present inventive concepts. For example, although it is described above that a plurality of gate signals are generated by the same gate driver, the respective gate signals may be generated by different gate drivers.

The inventive concepts may be applied to an electronic device including a display device. For example, the present inventive concept may be applied to a computer, a laptop, a cellular phone, a smart phone, a smart pad, a portable multimedia player (PMP), a personal digital assistant (PDA), an MP3 player, a digital camera, a video camcorder, etc.

Therefore, an organic light emitting display device according to the inventive concepts may secure a sufficient compensation time during which a threshold voltage of a driving transistor is compensated by driving a display panel using a simultaneous emission driving method by which a plurality of pixels simultaneously emit light. The organic light emitting display device may reduce a length (or, a time) of a non-emission period by storing a data signal of a current frame into a second capacitor of the pixel in an emission period of a previous frame and by adjusting a voltage at a gate electrode of a driving transistor of the pixel based on a voltage stored in the second capacitor in a data writing period of the current frame. Thus, the organic light emitting display device may have relatively high luminous efficiency and durability.

In addition, a pixel according to inventive concepts may operate at a high frequency because the pixel can secure a sufficient compensation time. Thus, the pixel may be applied to a high-resolution display device.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light emitting display device comprising:
    a display panel comprising a plurality of pixels; and
    a panel driver configured to provide a first gate signal, a second gate signal, a third gate signal, and a data signal to the pixels,
    wherein each of the pixels comprises:
        a first transistor comprising a gate electrode which is connected to a first node, a first electrode which receives a first power voltage, and a second electrode which is connected to a second node;
        a second transistor comprising a gate electrode which receives the third gate signal, a first electrode which is connected to the first node, and a second electrode which is connected to the second node;
        a third transistor comprising a gate electrode which receives the second gate signal, a first electrode which is connected to a third node, and a second electrode which is connected to the first node;
        a fourth transistor comprising a gate electrode which receives the first gate signal, a first electrode which receives the data signal, and a second electrode which is connected to the third node;

a first capacitor comprising a first electrode which receives a first voltage and a second electrode which is connected to the first node;

a second capacitor comprising a first electrode which receives a second voltage and a second electrode which is connected to the third node; and a light emitting element comprising a first electrode which is connected to the second node and a second electrode which receives a second power voltage, wherein the second electrode of the third transistor is directly connected to the second electrode of the first capacitor.

2. The organic light emitting display device of claim 1, wherein the data signal is applied to the second electrode of the second capacitor in at least a portion of an emission period in which the light emitting element emits light.

3. The organic light emitting display device of claim 1, wherein the panel driver is configured to drive the display panel by dividing one frame into a first period in which the first transistor is initialized, a second period in which a threshold voltage of the first transistor is compensated, a third period in which a voltage at the gate electrode of the first transistor is adjusted based on the data signal, and a fourth period in which the light emitting element emits light.

4. The organic light emitting display device of claim 3, wherein, in the first period, the third gate signal is activated, and the second gate signal and the first gate signal are deactivated.

5. The organic light emitting display device of claim 4, wherein, in the first period, the first power voltage is lower than the second power voltage.

6. The organic light emitting display device of claim 3, wherein, in the second period, the third gate signal is activated, and the second gate signal and the first gate signal are deactivated.

7. The organic light emitting display device of claim 3, wherein, in the third period, the second gate signal is activated, and the third gate signal and the first gate signal are deactivated.

8. The organic light emitting display device of claim 7, wherein, in the third period, the first power voltage is lower than the second power voltage.

9. The organic light emitting display device of claim 3, wherein:
the pixels are arranged in a plurality of pixel rows in the display panel; and
in the fourth period, the panel driver sequentially provides the first gate signal which is activated to the pixel rows.

10. The organic light emitting display device of claim 3, wherein, in the fourth period, the second gate signal and the third gate signal are deactivated.

11. The organic light emitting display device of claim 1, wherein:
the pixels are arranged in a plurality of pixel rows in the display panel;
the panel driver is configured to concurrently provide the second gate signal and the third gate signal to all of the pixel rows; and
the panel driver is configured to sequentially provide the first gate signal which is activated to the pixel rows in at least a portion of an emission period in which the light emitting element emits light.

12. The organic light emitting display device of claim 11, wherein the panel driver is configured to provide the data signal corresponding to a second frame to the pixels in at least the portion of the emission period of a first frame, the second frame following the first frame.

13. The organic light emitting display device of claim 1, wherein:
the first transistor is a p-channel metal oxide semiconductor (PMOS) transistor; and
the second transistor, the third transistor, and the fourth transistor are n-channel metal oxide semiconductor (NMOS) transistors.

14. A pixel comprising:
a first transistor comprising a gate electrode which is connected to a first node, a first electrode which receives a first power voltage, and a second electrode which is connected to a second node;
a second transistor comprising a gate electrode which receives a third gate signal, a first electrode which is connected to the first node, and a second electrode which is connected to the second node;
a third transistor comprising a gate electrode which receives a second gate signal, a first electrode which is connected to a third node, and a second electrode which is connected to the first node;
a fourth transistor comprising a gate electrode which receives a first gate signal, a first electrode which receives a data signal, and a second electrode which is connected to the third node;
a first capacitor comprising a first electrode which receives a first voltage and a second electrode which is connected to the first node;
a second capacitor comprising a first electrode which receives a second voltage and a second electrode which is connected to the third node; and
a light emitting element comprising a first electrode which is connected to the second node and a second electrode which receives a second power voltage,
wherein the second electrode of the third transistor is directly connected to the second electrode of the first capacitor.

15. The pixel of claim 14, wherein the data signal is applied to the second electrode of the second capacitor in at least a portion of an emission period in which the light emitting element emits light.

16. The pixel of claim 14, wherein, in a first period in which the first transistor is initialized, the third gate signal is activated, the second gate signal and the first gate signal are deactivated, and the first power voltage is lower than the second power voltage.

17. The pixel of claim 14, wherein, in a second period in which a threshold voltage of the first transistor is compensated, the third gate signal is activated, and the second gate signal and the first gate signal are deactivated.

18. The pixel of claim 14, wherein, in a third period in which a voltage at the gate electrode of the first transistor is adjusted based on the data signal, the second gate signal is activated, the third gate signal and the first gate signal are deactivated, and the first power voltage is lower than the second power voltage.

19. The pixel of claim 14, wherein, in at least a portion of a fourth period in which the light emitting element emits light, the first gate signal is activated.

20. The pixel of claim 14, wherein:
the first transistor is a p-channel metal oxide semiconductor (PMOS) transistor; and
the second transistor, the third transistor, and the fourth transistor are n-channel metal oxide semiconductor (NMOS) transistors.

* * * * *